United States Patent [19]

Schumacher

[11] Patent Number: 5,170,118
[45] Date of Patent: Dec. 8, 1992

[54] CIRCUIT AND METHOD FOR TESTING INVERTER DRIVE LOGIC SWITCHING PATTERNS

[75] Inventor: Mark E. Schumacher, Lima, Ohio

[73] Assignee: Sundstrand Corporation, Rockford, Ill.

[21] Appl. No.: 744,727

[22] Filed: Aug. 14, 1991

[51] Int. Cl.⁵ ................. H02M 1/12; H02M 5/458
[52] U.S. Cl. ................. 324/158 R; 324/73.1; 363/41
[58] Field of Search ......... 324/158 R, 73.1, 110; 363/41, 131; 340/644, 645, 653; 307/265; 377/44; 318/603; 371/15.1, 25.1, 16.1

[56] References Cited

U.S. PATENT DOCUMENTS

| | | | |
|---|---|---|---|
| 4,228,477 | 10/1980 | Claus et al. | 340/645 |
| 4,575,718 | 3/1986 | Ludowyk | 340/644 |
| 4,870,664 | 9/1989 | Hayashi | 377/44 |
| 4,878,163 | 10/1989 | Yamato et al. | 363/41 |
| 4,982,109 | 1/1991 | Burwell | 307/265 |
| 5,043,857 | 8/1991 | Kirchberg, Jr. et al. | 363/41 |

*Primary Examiner*—Vinh Nguyen
*Attorney, Agent, or Firm*—Michael S. Yatsko

[57] ABSTRACT

A method for testing an inverter drive logic switching pattern signal combines six pulse width modulated switching signal pairs into six intermediate signals and further combines these six intermediate signals to produce three composite signals. The three composite signals are used to produce a test signal which is monitored to detect a failure in at least one of the pulse width modulated switching signals. Individual pairs of the intermediate signals can be further combined to produce three additional test signals which are used to detect a failure in a particular one of the pulse width modulated signals. These three additional test signals can be further combined to produce a fifth test signal which can be analyzed to detect an abnormal polarity in the pulse width modulated switching signals. Both the above test method and circuits which perform that method are disclosed.

24 Claims, 7 Drawing Sheets

CIRCUIT AND METHOD FOR TESTING INVERTER DRIVE LOGIC SWITCHING PATTERNS

BACKGROUND OF THE INVENTION

This invention relates to circuits and method for testing inverter drive logic switching pattern signals and, more particularly, to built-in-test circuits for three phase inverters and the test methods performed by those circuits.

DC link, variable speed constant frequency (VSCF) power systems, such as those designed for aircraft applications, include a variable speed generator whose output is rectified to produce a DC voltage, and an electronic inverter which converts the DC voltage to a constant frequency AC output. Such inverters incorporate waveform generating circuits which drive power transistors to produce a quasi-sinewave which is filtered to produce a sinewave output. Typical inverter drive logic (IDL) circuits produce pulse width modulated waveform switching signal patterns which are used to control the switching of the output power poles of the inverter to produce a quasi-sinewave of low harmonic content that can be easily filtered. A typical IDL circuit produces four pulse width modulated waveform switching patterns to drive each output phase of the inverter. Two of the waveform patterns would be used to switch a positive (upper) semiconductive switch on and off, respectively, while the other two waveform patterns would be used to switch a corresponding negative (lower) semiconductor switch on and off. For a three phase inverter, twelve pulse width modulated switching signals are required. These signals are typically low level transistor-transistor logic (TTL) signals.

Previous build-in test (BIT) circuits for inverter drive logic function monitored a periodic waveform marker output of the IDL by using a power controller computer. However, this waveform marker did not contain any information about the operational status of the individual pulse width modulated switching signals. It is therefore desirable to devise an inverter drive logic built-in-test scheme which can determine the operational status of all twelve of the individual IDL waveform pattern switching signals.

SUMMARY OF THE INVENTION

This invention provides a method for testing an inverter drive logic switching pattern signal for a three phase DC to AC inverter in which twelve pulse width modulated inverter drive logic switching signals are combined to produce six intermediate signals and these six signals are further combined to produce three composite signals. The composite signals are, in turn, used to produce a first test signal which can be monitored to detect a failure in at least one of the pulse width modulated switching signals. Individual pairs of the intermediate signals can also be combined to produce additional test signals which can be monitored to detect a failure in a particular one of the pulse width modulated signals. These additional test signals can further be combined to produce yet another test signal which is used to detect an abnormal polarity in at least one of the pulse width modulated signals.

This invention encompasses both the above built-in-test method and electronic circuits which operate according to the method. Such circuits can determine the operational status of the inverter drive logic waveform switching patterns prior to and after energizing the inverter and a particular faulty phase of the inverter drive logic can be isolated. These circuits can also be easily integrated with existing IDL waveform generators which are typically implemented in digital gate arrays.

BRIEF DESCRIPTION OF THE DRAWINGS

The present invention will become more readily apparent from the following description of the preferred embodiment thereof, shown by way of example only, in the accompanying drawings wherein.

DESCRIPTION OF THE PREFERRED EMBODIMENT

Figure 1:
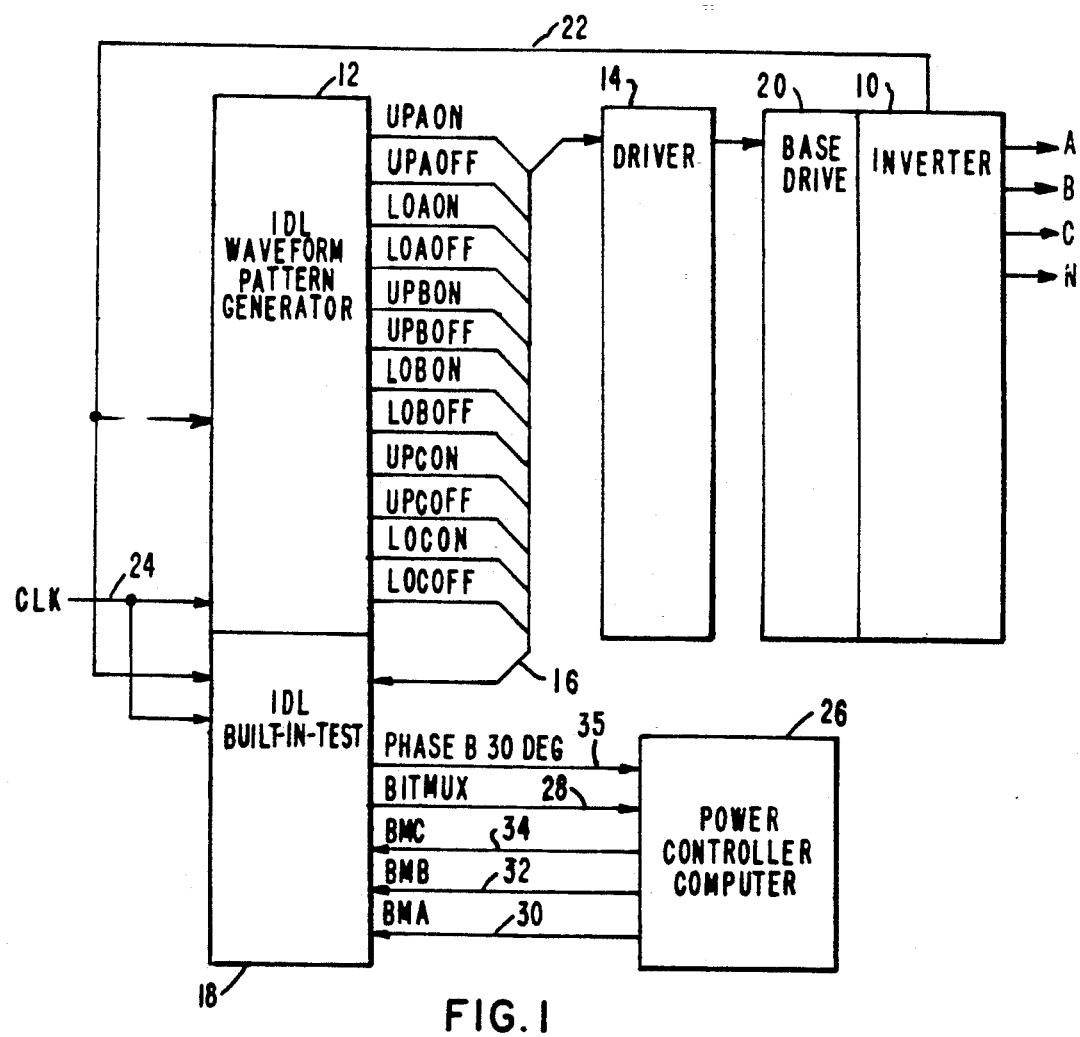
FIG. 1 is a block diagram of a portion of an electronic inverter which incorporates the present invention.

Referring to the drawings, FIG. 1 is a block diagram of an inverter portion of a VSCF power system. In this embodiment, the inverter 10 is used to convert DC power to a high quality, three phase 400 Hz AC output. An inverter drive logic waveform pattern generator 12 provides 12 pulse width modulated switching signals which control the operation of six transistors forming the three output power poles of the inverter 10. Signals UPAON and UPAOFF are used to control the upper transistor of power pole A by turning it on and off, respectively. Signals LOAON and LOAOFF control the lower switching transistor of power pole A by turning it on and off, respectively. Signals UPBON, UPBOFF, LOBON and LOBOFF perform similar control functions for the phase B power pole output switches. Similarly, signals UPCON, UPCOFF, LOCON and LOCOFF control the operation of the upper and lower switching transistors for the phase C power pole. These low level TTL signals are buffered by a driver circuit 14 and are also delivered by way of bus 16 to an IDL built-in-test circuit 18. The output of driver 14 feeds a base 4 56,738 drive circuit 20 which in turn controls the inverter switching transistors.

The IDL switching pattern signals are under-lapped and time corrected for inverter on/off switching delays by the IDL waveform pattern generator in accordance with three inverter power pole feedback signals which are delivered to the IDL waveform pattern generator by way of line 22. An external clock provides a clock signal to the IDL waveform pattern generator and the IDL built-in-test circuit by way of line 24. A power controller computer 26 receives various test signals produced by the IDL built-in-test circuit on line 28, which is generally designated as a multiplexed output BITMUX. Individual test signals produced by the IDL built-in-test circuit are selected by the power controller by way of signals BMA, BMB and BMC on lines 30, 32 and 34, respectively. The power controller computer analyzes signal BMUXOUT for one time interval (one inverter output cycle), which is defined by signal PHASE B 30 DEG on line 35.

Figure 2:
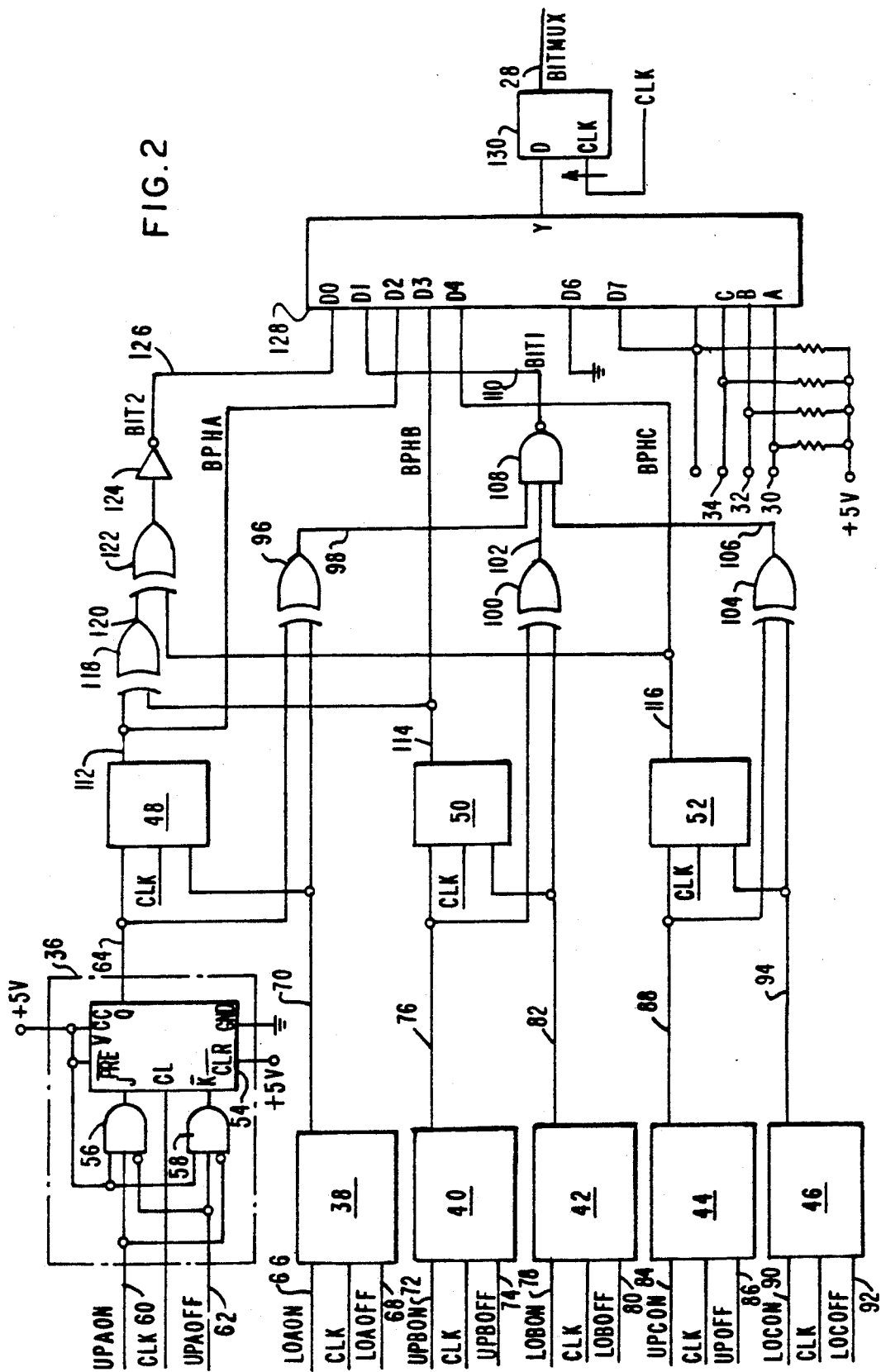
FIG. 2 is a schematic diagram of a circuit constructed in accordance with the preferred embodiment of the present invention.

FIG. 2 is a schematic diagram of an IDL built-in-test circuit constructed in accordance with the preferred embodiment of this invention. The circuit includes a plurality of JK flip-flop circuits with data lock-out 36, 38, 40, 42, 44, 46, 48, 50 and 52. These circuits are identical and each one includes a JK flip-flop circuit 54 and a pair of AND circuits 56 and 58 connected as illustrated for circuit 36. An external clock signal is applied to each circuit by way of the line labeled CLK.

JK flip-flop circuit 36 combines a first inverter drive logic pulse width modulated switching signal UPAON on line 60 with a second inverter drive logic pulse width modulated switching signal UPAOFF on line 62 to produce a first intermediate signal on line 64. Circuit 38 combines signals LOAON on line 66 and LOAOFF on line 68 to produce a second intermediate signal on line 70. Circuit 40 combines signals UPBON on line 72 and UPBOFF on line 74 to produce a third intermediate signal on line 76. Circuit 42 combines signals LOBON on line 78 and LOBOFF on line 80 to produce a fourth intermediate signal on line 82. Circuit 44 combines signals UPCON on line 84 and UPCOFF on line 86 to produce a fifth intermediate signal on line 88. Circuit 46 combines signals LOCON on line 90 and LOCOFF on line 92 to produce a sixth intermediate signal 94.

Exclusive OR gate 96 is used to combine the first and second intermediate signals to produce a first composite signal on line 98. Exclusive OR gate 100 combines the third and fourth intermediate signals to produce a second composite signal on line 102. Exclusive OR gate 104 combines the fifth and sixth intermediate signals to produce a third composite signal on line 1 06. The first, second and third composite signals are combined by NAND gate 108 to produce a first test signal BIT1 on line 110.

JK flip-flop circuit 48 is used to combine the first and second intermediate signals on lines 64 and 70 to produce a second test signal BPHA on line 112. JK flip-flop circuit 50 is used to combine the third and fourth intermediate signals on lines 76 and 82 to produce a third test signal BPHB on line 114. JK flip-flop circuit 52 is used to combine the fifth and sixth intermediate signals on lines 88 and 94 to produce a fourth test signal BPHC on line 116. Exclusive OR gate 118 receives the second and third test signals, BPHA and BPHB, and produces a combined signal on line 120. Exclusive OR gate 122 receives the combined signal and the fourth test signal BPHC to produce an output which is inverted by inverter 124 to produce the fifth test signal BIT2 on line 126. A multiplexer 128 receives the five test signals and passes one of those five test signals through type D flip-flop 130 to the power controller computer 26 in FIG. 1. The computer selects which of the five signals is to be analyzed by providing signals on lines 30, 32 and 34. Signal BITMUX then comprises the selected one of the five test signals.

The circuit of FIG. 2 utilizes the twelve pulse width modulated inverter drive logic switching pattern signals to produce five unique built-in-test signals through the use of simple clocked logic operations. The operations performed by this circuit are defined in Table 1.

TABLE 1

BIT Logic Operations

| BMC | BMB | BMA | BITMUX | Function |
|-----|-----|-----|--------|----------|
| 0 | 0 | 0 | BIT2 | (A xor B) xor C |
| 0 | 0 | 1 | BIT1 | D |
| 0 | 1 | 0 | BPHA | A |
| 0 | 1 | 1 | BPHB | B |
| 1 | 0 | 0 | BPHC | C |

UPA = F1 (UPAON, UPAOFF)
UPB = F1 (UPBON, UPBOFF)
UPC = F1 (UPCON, UPCOFF)
LOA = F1 (LOAON, LOAOFF)
LOB = F1 (LOBON, LOBOFF)
LOC = F1 (LOCON, LOCOFF)
A = F1 (UPA, LOA)
B = F1 (UPB, LOB)
C = F1 (UPC, LOC)

D = $\overline{[(UPA\ XOR\ LOA) \cdot (UPB\ XOR\ LOB) \cdot (UPC\ XOR\ LOC)]}$

Where F1 (X, Y) is defined:

| X | Y | CLK | F1 (X,Y) |
|---|---|-----|----------|
| 0 | 0 | Rising | Q(n−1) |
| 0 | 1 | Rising | A |
| 1 | 0 | Rising | A |
| 1 | 1 | Rising | Q(n−1) |

Figure 3:
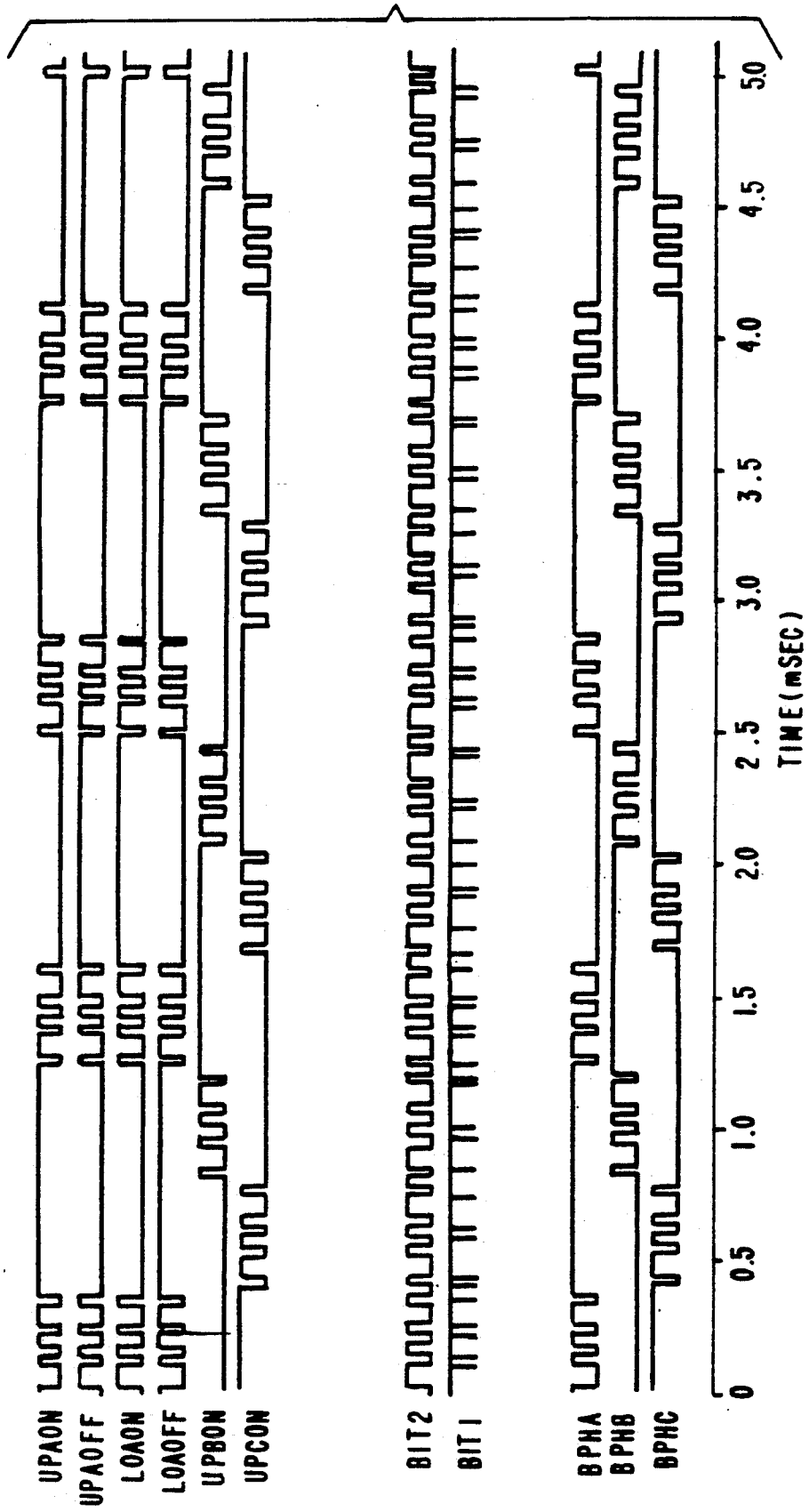
FIGS. 3, 4, 5, 6 and 7 are a series of waveforms which are used to illustrate the operation of the circuit of FIG. 2.
Figure 4:
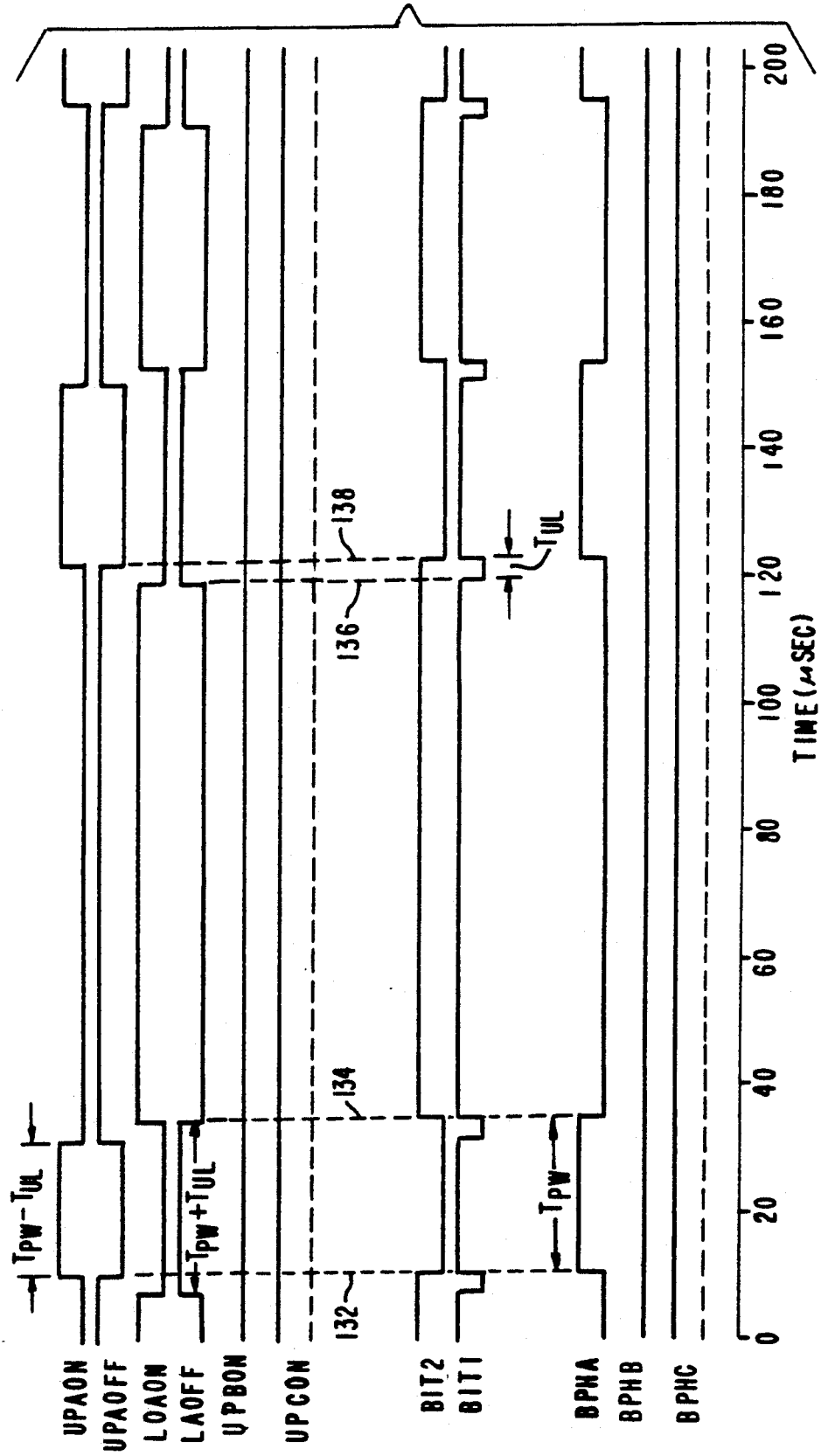

The built-in-test circuit utilizes the normal characteristics of a basic inverter drive logic switching pattern in the production of the five built-in-test signals. FIGS. 3 and 4 illustrate typical normally operating inverter drive logic waveform switching patterns as well as the five derived built-in-test signals. Complete switching patterns are illustrated for the four signals relating to the output phase A of an inverter while only the upper switch ON signals are shown for phases B and C. The remaining signals for phases B and C can be readily derived based on the normal operating characteristics of the signals wherein:

1) Only one phase A, B, or C switches at any time.
2) UPPER ON is the complement of UPPER OFF.
3) LOWER ON is the complement of LOWER OFF.
4) UPPER ON is the complement of LOWER ON except for an underlap time.
5) UPPER OFF is the complement of LOWER OFF except for an underlap time.

The waveforms of FIG. 3 show that signal BIT2 is a composite of signals BPHA, BPHB and BPHC. The four signals UPAON, UPAOFF, LOAON and LOAOFF are used to produce signal BPHA. Signals BPHB and BPHC are produced similarly by combining the switching pattern signals for phases B and C, respectively. FIG. 4 illustrates the waveforms of FIG. 3 with an expanded time scale. The first pulse in signal UPAON is shown to have a duration equal to $T_{PW}-T_{UL}$, wherein $T_{PW}$ is the actual pulse width and $T_{UL}$ is an underlap time. The first pulse in signal LOAOFF is seen to have a duration equal to $T_{PW}+T_{UL}$. As shown by vertical lines 132 and 134, the upper and lower transistor switching pattern signals are combined to produce a first pulse in test signal BPHA which has a width of $T_{PW}$, the actual IDL pulse width with the underlap removed. Test signal BIT1 has pulses having durations equal to the underlap time $T_{UL}$ as illustrated by vertical lines 136 and 138.

Figure 5:
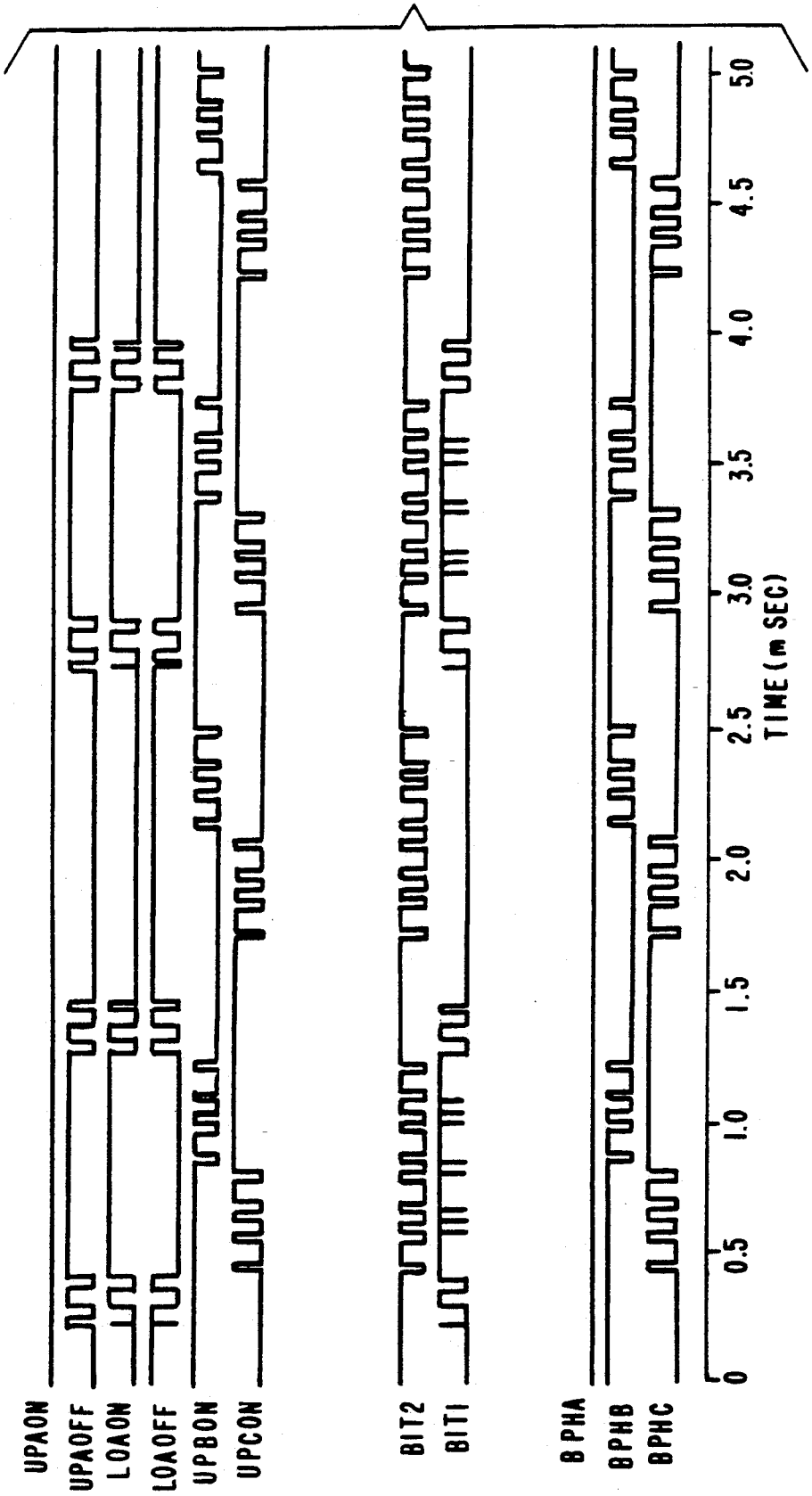
Figure 6:
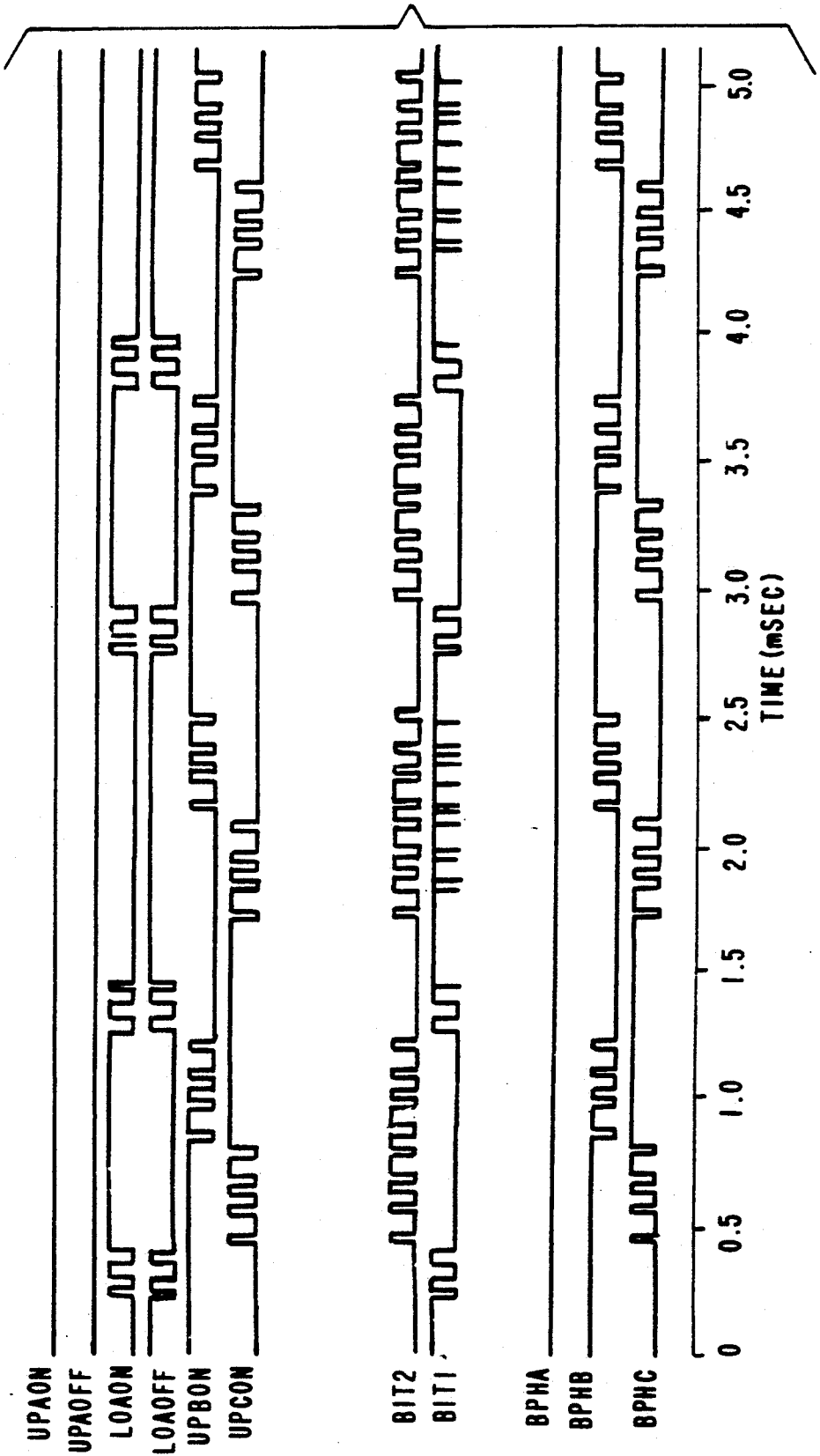
Figure 7:
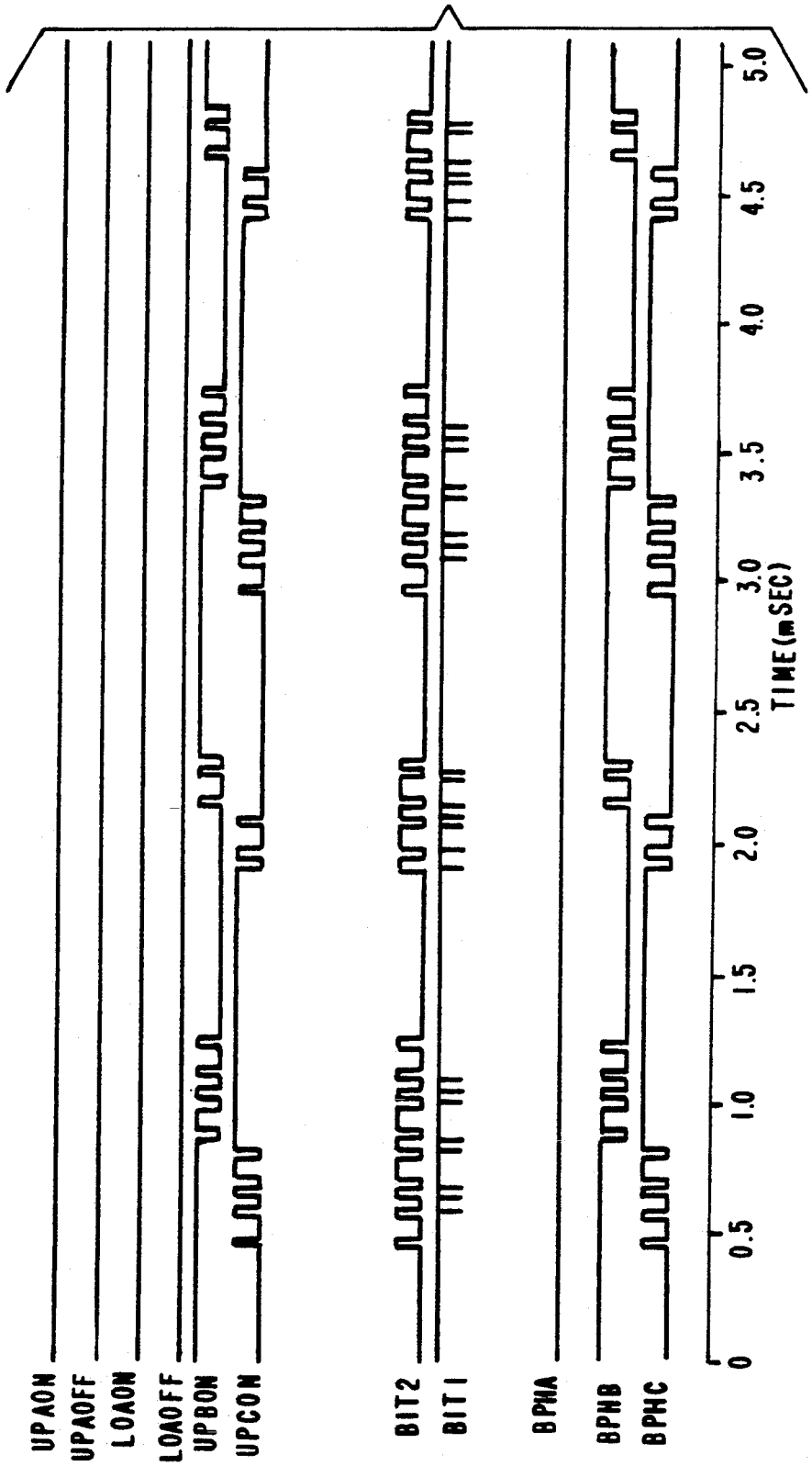

The five output test signals of the built-in-test circuit of FIG. 2 which result from several fault conditions are shown in FIGS. 5 through 7. FIG. 5 shows the output signals for a single fault, signal UPAON stuck low. Note the irregular pulse patterns on signals BIT1, BIT2, and BPHA. Signal BIT2 has only 36 pulses per inverter output period instead of the 54 pulses expected Signal BIT1 has 26 pulses per period with 108 expected. Isolation to the faulty phase is easily performed by inspection of signals BPHA, BPHB and BPHC. Signal BPHA has no pulses while 18 were expected for normal conditions. Signals BPHB and BPHC have normal waveforms. It is noted that the slightly irregular input pattern present on signals UPAOFF, LOAON and LOAOFF is the result of the IDL pattern generator reacting to the IDL feedback signals under this fault condition.

FIG. 6 shows the built-in-test circuit output for a double fault, signals UPAON and UPAOFF stuck low. FIG. 7 shows the built-in-test output signals for a quadruple fault, signals UPAON, UPAOFF, LOAON and LOAOFF all stuck low. In each case, the fault condition is detected as an abnormal waveform on signals BIT1 and BIT2 and the faulty phase is successfully isolated by an analysis of signals BPHA, BPHB and BPHC.

Built-in-test circuits constructed in accordance with this invention combine six normally complementary pulse width modulated inverter drive logic signal pairs into six intermediate signals. The use of a JK flip-flop circuit with data lock-out logic to perform this combination guarantees that the inputs must be opposite in order for the output to toggle. For normal conditions, each of the six intermediate signals is identical to the corresponding ON signal input. These six signals are combined in accordance with the functions of Table 1 to produce five built-in-test signals which are illustrated in FIGS. 3 and 4.

The built-in-test circuit enables a power controller computer to monitor all timing aspects of the twelve inverter drive logic outputs in real time by analysis of only one signal BIT1. If an abnormal waveform occurs, such as a signal having a wrong pulse width or missing pulses, signal BIT2 can be interrogated for a polarity problem and signals BPHA, BPHB and BPHC can be interrogated to isolate the faulty phase.

Signal BIT1 is a composite signal of all twelve inverter drive logic signals representing the pole drive switching points of the switching poles. Underlap between the upper and lower drives can be measured along with whole drive pulse widths $(t_{PW}-t_{UL})$. The signal does not contain the actual pole drive polarity as the other built-in-test signals do. In the preferred embodiment of this invention, signal BIT1 has 108 pulses per period.

Signal BIT2 is a composite signal of all twelve inverter drive logic signals representing the pole drive polarity of the switching pole. Note that underlap between the upper and lower signals is not measurable in this signal. The signal normally has 54 pulses per period. In addition, any underlap time inserted into the waveform between the upper and lower signals is removed so the actual control signal without underlap distortion can be analyzed.

Signals BPHA, BPHB and BPHC each represent a composite of four inverter drive logic signals for one inverter power pole. These signals represent the pole drive polarity. Underlap between the upper and lower signals is not measurable in these signals. In the preferred embodiment, these signals have 18 pulses per period.

Signal BITMUX is the ultimate output signal of the built-in-test circuitry and is a single multiplexed signal controlled by inputs BMA, BMB and BMC. Selection of any of the five built-in-test signals can be made. The multiplexed output is synchronized to the inverter drive clock signal to prevent glitches on the output signal.

The circuits and methods of this invention produce a single output which simultaneously monitors all twelve inverter drive logic signals. Using simple techniques which can be easily implemented in a digital gate array, actual inverter drive logic pattern generator chip output signals are monitored such that any faulty phase of the inverter can be isolated. The output signals actively reflect both single and multiple fault conditions. In addition, the outputs permit analysis of either the underlap and the IDL signals or the undistorted control signals with the underlap removed.

Although this invention has been described in terms of its preferred embodiment, it will be apparent to those skilled in the art that various changes may be made without departing from the scope of the invention. It is therefore intended that the appended claims cover such changes.

What is claimed is:

1. A method for testing an inverter drive logic switching pattern signal, said method comprising the steps of:
    combining six pulse width modulated switching signal pairs into six intermediate signals;
    combining said six intermediate signals to produce three composite signals;
    combining said three composite signals to produce a first test signal; and
    analyzing said first test signal to detect a failure in at least one of the pulse width modulated switching signals.

2. A method for testing an inverter drive logic switching pattern signal, as recited in claim 1, further comprising the steps of:
    combining said a first pair of said six intermediate signals to produce a second test signal;
    combining said a second pair of said six intermediate signals to produce a third test signal;
    combining said a third pair of said six intermediate signals to produce a fourth test signal; and
    analyzing said second, third and fourth test signals to detect a failure in a particular one of said pulse width modulated signals.

3. A method for testing an inverter drive logic switching pattern signal, as recited in claim 2, further comprising the steps of:
    combining said second, third and fourth test signals to produce a fifth test signal; and analyzing said fifth test signal to detect an abnormal polarity in at least one of the pulse width modulated switching signals.

4. A circuit for testing an inverter drive logic switching pattern signal, said circuit comprising:
   means for combining six pulse width modulated switching signal pairs into six intermediate signals;
   means for combining said six intermediate signals to produce three composite signals;
   means for combining said three composite signals to produce a first test signal; and
   computer means for analyzing said first test signal to detect a failure in at least one of the pulse width modulated switching signals.

5. A circuit for testing an inverter drive logic switching pattern signal, as recited in claim 4, wherein said means for combining six pulse width modulated switching signal pairs into six intermediate signals comprises:
   six J-K flip-flop circuits with data lock-out, each of said J-K flip-flop circuits having a pair of inputs for receiving one of said pulse width modulated signal pairs, and an output for producing one of said six intermediate signals.

6. A circuit for testing an inverter drive logic switching pattern signal, as recited in claim 4, wherein said means for combining said six intermediate signals to produce three composite signals comprises:
   a first exclusive OR gate having two inputs for receiving a first pair of said six intermediate signals, and an output for producing a first one of said composite signals;
   a second exclusive OR gate having two inputs for receiving a second pair of said six intermediate signals, and an output for producing a second one of said composite signals; and
   a third exclusive OR gate having two inputs for receiving a third pair of said six intermediate signals, and an output for producing a third one of said composite signals.

7. A circuit for testing an inverter drive logic switching pattern signal, as recited in claim 4, wherein said means for combining said three composite signals to produce a first test signal comprises:
   a NAND gate having three inputs for receiving said first, second and third composite signals, and an output for producing said first test signal.

8. A circuit for testing an inverter drive logic switching pattern signal, as recited in claim 4, further comprising:
   means for combining said a first pair of said six intermediate signals to produce a second test signal;
   means for combining said a second pair of said six intermediate signals to produce a third test signal;
   means for combining said a third pair of said six intermediate signals to produce a fourth test signal; and
   wherein said computer means also analyzes said second, third and fourth test signals to detect a failure in a particular one of said pulse width modulated signals.

9. A circuit for testing an inverter drive logic switching pattern signal, as recited in claim 8, wherein said means for combining said a first pair of said six intermediate signals to produce a second test signal, said means for combining said a second pair of said intermediate signals to produce a third test signal, and said means for combining said a third pair of said six intermediate signals to produce a fourth test signal each comprises:
   a J-K flip-flop circuit with data lock-out, each of said J-K flip-flop circuits having a pair of inputs for receiving one of said pairs of intermediate signals, and an output for producing one of said second, third and fourth test signals.

10. A circuit for testing an inverter drive logic switching pattern signal, as recited in claim 8, further comprising:
    means for combining said second, third and fourth test signals to produce a fifth test signal; and
    wherein said computer means also analyzes said fifth test signal to detect an abnormal polarity in at least one of the pulse width modulated switching signals.

11. A circuit for testing an inverter drive logic switching pattern signal, as recited in claim 10, wherein said means for combining said second, third and fourth test signals to produce a fifth test signal comprises:
    a first exclusive OR gate having two inputs for receiving said second and third test signals, and an output for producing a combined signal; and
    a second exclusive OR gate having two inputs for receiving said fourth signal and said combined signal, and an output for producing said fifth test signal.

12. A method for testing an inverter drive logic switching pattern signal, said method comprising the steps of:
    combining six pulse width modulated switching signal pairs into six intermediate signals;
    combining said six intermediate signals to produce five test signals;
    analyzing a first one of the test signals to detect a failure in at least one of the pulse width modulated switching signals;
    analyzing second, third, and fourth ones of the test signals to detect a failure in a particular one of said pulse width modulated signals; and
    analyzing a fifth one of the test signals to detect an abnormal polarity in at least one of the pulse width modulated switching signals.

13. A circuit for testing an inverter drive logic switching pattern signal comprising:
    means for combining six pulse width modulated switching signal pairs into six intermediate signals;
    means for combining said six intermediate signals to produce five test signals; and
    means for analyzing a first one of the test signals to detect a failure in at least one of the pulse width modulated switching signals, analyzing second, third, and fourth ones of the test signals to detect a failure in a particular one of said pulse width modulated switching signals, and analyzing a fifth one of the test signals to detect an abnormal polarity in at least one of the pulse width modulated switching signals.

14. A method for testing an inverter drive logic switching pattern signal, said method comprising the steps of:
    combining a first pair of pulse width modulated switching signals to produce a first intermediate signal;
    combining a second pair of pulse width modulated switching signals to produce a second intermediate signal;
    combining a third pair of pulse width modulated switching signals to produce a third intermediate signal;

combining a fourth pair of pulse width modulated switching signals to produce a fourth intermediate signal;

combining a fifth pair of pulse width modulated switching signals to produce a fifth intermediate signal;

combining a sixth pair of pulse width modulated switching signals to produce a sixth intermediate signal;

combining a first pair of said intermediate signals to produce a first composite signal;

combining a second pair of said intermediate signals to produce a second composite signal;

combining a third pair of said intermediate signals to produce a third composite signal;

combining said first, second and third composite signals to produce a first test signal; and analyzing said first test signal to determine the operational status of said switching signals.

15. A method for testing an inverter drive logic switching pattern signal as recited in claim 14, said method further comprising the steps of:

combining said first pair of said intermediate signals to produce a second test signal;

combining said second pair of said intermediate signals to produce a third test signal;

combining said third pair of said intermediate signals to produce a fourth test signal; and analyzing said second, third, and fourth test signals to determine the operational status of said first, second and third pairs of said switching signals respectively.

16. A method for testing an inverter drive logic switching pattern signal as recited in claim 15, said method further comprising the steps of:

combining said second, third, and fourth test signals to produce a fifth test signal; and analyzing said fifth test signal to determine the polarity of said first, second and third pairs of said switching signals.

17. A circuit for testing an inverter drive logic switching pattern signal, said circuit comprising:

means for combining a first pair of pulse width modulated switching signals to produce a first intermediate signal;

means for combining a second pair of pulse width modulated switching signals to produce a second intermediate signal;

means for combining a third pair of pulse width modulated switching signals to produce a third intermediate signal;

means for combining a fourth pair of pulse width modulated switching signals to produce a fourth intermediate signal;

means for combining a fifth pair of pulse width modulated switching signals to produce a fifth intermediate signal;

means for combining a sixth pair of pulse width modulated switching signals to produce a sixth intermediate signal;

means for combining a first pair of said intermediate signals to produce a first composite signal;

means for combining a second pair of said intermediate signals to produce a second composite signal;

means for combining a third pair of said intermediate signals to produce a third composite signal;

means for combining said first, second and third composite signals to produce a first test signal; and means for analyzing said test signal to determine the operational status of said switching signals.

18. A circuit for testing an inverter drive logic switching pattern signal as recited in claim 17, wherein:

said means for combining a first pair of pulse width modulated switching signals comprises a first J-K flip flop with data lock-out;

said means for combining a second pair of pulse width modulated switching signals comprises a second J-K flip flop with data lock-out;

said means for combining a third pair of pulse width modulated switching signals comprises a third J-K flip flop with data lock-out;

said means for combining a fourth pair of pulse width modulated switching signals comprises a fourth J-K flip flop with data lock-out;

said means for combining a fifth pair of pulse width modulated switching signals comprises a fifth J-K flip flop with data lock-out; and said means for combining a sixth pair of pulse width modulated switching signals comprises a sixth J-K flip flop with data lock-out.

19. A circuit for testing an inverter drive logic switching pattern signal as recited in claim 18, wherein:

said means for combining a first pair of said intermediate signals comprises a first exclusive OR gate;

said means for combining a second pair of said intermediate signals comprises a second exclusive OR gate; and said means for combining a third pair of said intermediate signals comprises a third exclusive OR gate.

20. A circuit for testing an inverter drive logic switching pattern signal as recited in claim 19, wherein:

said means for combining said first, second and third composite signals comprises an NAND gate.

21. A circuit for testing an inverter drive logic switching pattern signal as recited in claim 17, said circuit further comprising:

means for combining said first pair of said intermediate signals to produce a second test signal;

means for combining said second pair of said intermediate signals to produce a third test signal;

means for combining said third pair of said intermediate signals to produce a fourth test signal; and means for analyzing said second, third, and fourth test signals to determine the operational status of said first, second and third pairs of said switching signals respectively.

22. A circuit for testing an inverter drive logic switching pattern signal as recited in claim 21, wherein:

said means for combining said first pair of said intermediate signals comprises a seventh J-K flip-flop with data lock-out;

said means for combining said second pair of said intermediate signals comprises an eighth J-K flip-flop with data lock-out; and said means for combining said third pair of said intermediate signals comprises a ninth J-K flip-flop with data lock-out.

23. A circuit for testing an inverter drive logic switching pattern signal as recited in claim 21, said circuit further comprising:

means for combining said second, third, and fourth test signals to produce a fifth test signal; and means for analyzing said fifth test signal to pairs of said switching signals.

24. A circuit for testing an inverter drive logic switching pattern signal as recited in claim 23, wherein said means for combining said second, third, and fourth test signals comprises:
 a fourth exclusive OR gate connected to receive said second and third test signals and having an output for producing a combined signal; and
 a fifth exclusive OR gate connected to receive said combined signal and said fourth test signal and having an output for producing said fifth test signal.

* * * * *